United States Patent [19]
Fujita et al.

[11] Patent Number: 5,104,826
[45] Date of Patent: Apr. 14, 1992

[54] METHOD FOR FABRICATING SEMICONDUCTOR INTEGRATED CIRCUIT DEVICE USING AN ELECTRODE WIRING STRUCTURE

[75] Inventors: Tsutomu Fujita, Hirakata; Toyokazu Fujii, Moriguchi, both of Japan

[73] Assignee: Matsushita Electric Industrial Co., Ltd., Osaka, Japan

[21] Appl. No.: 470,579

[22] Filed: Jan. 26, 1990

[30] Foreign Application Priority Data

Feb. 2, 1989 [JP] Japan .................... 1-24217

[51] Int. Cl.$^5$ ............................ H01L 21/44
[52] U.S. Cl. .................... 437/190; 437/192; 437/195; 437/200
[58] Field of Search ............... 437/190, 192, 195, 200

[56] References Cited

U.S. PATENT DOCUMENTS

| | | | |
|---|---|---|---|
| 4,624,864 | 11/1986 | Hartmann | 437/192 |
| 4,800,177 | 1/1989 | Nakamae | 437/192 |
| 4,822,753 | 4/1989 | Pintchovski et al. | 437/192 |
| 4,851,369 | 7/1989 | Ellwanger et al. | 437/192 |

OTHER PUBLICATIONS

R. S. Schutz, "TiN as a Diffusion Barrier Between CoSi$_2$ or P+Si and Aluminum", *MRS Proceedings*, vol. 18, No. 89 (1982), pp. 89-99.

Y. Pauleau, "Interconnect Materials for VLSI Circuits", *Solid State Technology*, Apr. 1987, pp. 155-162.

C. Y. Ting, "TiN found by Evaporation as a Diffusion Barrier Between Al and Si,", *J. Vac. Sci. Tech.*, vol. 21, No. 1, May/Jun. 1982, pp. 14-18.

T. Nishida et al., "Multilevel Interconnection for Half-Micron ULSI's", 1989 VMIC Conference, Jun. 12-13, 1989, pp. 19-25.

E. Broodbent et al., "The High-Temperature Stability of CVD W-S; Couples RTA in NH$_3$ and Ar", *Journal of Applied Physics*, vol. 64, No. 12, Dec. 1988, pp. 6721-6726.

*Primary Examiner*—Brian E. Hearn
*Assistant Examiner*—Laura M. Holtzman
*Attorney, Agent, or Firm*—Stevens, Davis, Miller & Mosher

[57] ABSTRACT

In a CVD contact formed on a shallow junction having a depth of 0.2 micron or less, the presence of aluminum generates a leakage current at the junction after heat treatment. In order to restrain the leakage current, a barrier metal is formed below the aluminum electrode to form an Al/barrier metal/CVDW (tungsten) structure. A contact free from junction leakage and having a high aspect ratio is thereby realized.

2 Claims, 6 Drawing Sheets

Aℓ / TiN / CVDW / n⁺Si CONTACT

Aℓ / CVDW / n⁺Si CONTACT

Aℓ / TiN / n⁺Si CONTACT

METHOD FOR FABRICATING SEMICONDUCTOR INTEGRATED CIRCUIT DEVICE USING AN ELECTRODE WIRING STRUCTURE

BACKGROUND OF THE INVENTION

The present invention relates to a method for fabricating an electrode wiring structure with fine contacts with a high aspect ratio formed on a shallow junction which have low contact resistance and reduced leakage, and a semiconductor integrated circuit device using such wiring structure.

As is well known, when contacts for electrodes of a semiconductor device are miniaturized and the aspect ratio is increased, the following problems occur. The first problem is that the aluminum wiring containing silicon, which is used as an electrode contact with mono-crystalline silicon, increases the contact resistance due to the silicon precipitation in a sintering step. The second problem is that the conventional electrode structure made by sputtering does not permit metal to invade into contacts due to the high aspect ratio and so may disconnect from the semiconductor device. In order to solve the above problems, a technique of selectively filling tungsten (W) through CVD (chemical vapor deposition) as shown in FIG. 4 has been developed, as disclosed in IEDM 87 9-5 "A Highly Relaible CVD-W Utilizing SiH$_4$ Reduction for VLSI contacts".

In FIG. 4, 9 is a silicon (Si) substrate; 10 is an n+highly doped diffused layer; 11 is an inter-layer insulator layer; 13 is tungsten (W) selectively filled in the contact 12 through CVD; 15 is an aluminum electrode; 14 is a boundary between the tungsten area and the aluminum electrode; and 50 is a boundary between the tungsten area and, the insulator film 11. In such an electrode structure, tungsten 13 is filled in the contact 12 so that the aspect ratio of the contact exceeding 1 is improved and so the electrode will not disconnect from the diffused layer 10.

The sintering step, however, diffuses aluminum 15 through the boundary 50 between the tungsten area 13 and the insulator layer 11 so that aluminum 15 may invade into the diffused layer as indicated by 16 through the reaction of the diffused layer with aluminum and tungsten thereby to destroy the junction in the diffused layer 10; incidentally aluminum does not diffuse through the boundary 14 because tungsten 13 serves as a sufficient barrier against aluminum.

In order to prevent aluminum from invading into a silicon (Si) substrate in the sintering step, barrier metal deposited by sputtering as shown in FIG. 5 is usually used. This technique, however, provides poor step coverage for the contact having an aspect ratio exceeding 1 and so cannot sufficiently prevent the invasion of aluminum.

In FIG. 5 17 is an Si substrate; 18 is a highly doped diffused layer; 19 is an inter-layer insulator film; 20 is a contact having an aspect ratio exceeding 1; 21 is a barrier metal of TiN (titanium nitride); and 22 is an aluminum electrode. As seen from FIG. 5, the barrier metal is broken as indicated by 21-1 so that the electrode 22 is disconnected from the diffused layer 18.

The above problems become remarkable as the junction layer below the contact is shallow and the aspect ratio of the contact is large.

SUMMARY OF THE INVENTION

An object of the present invention is to provide a method for fabricating an electrode wiring structure with fine contacts with a high aspect ratio formed on a shallow junction which have low contact resistance and reduced leakage, and a semiconductor integrated circuit device using such wiring structure.

In order to attain the above object, in accordance with the present invention, there is provided an electrode wiring structure comprising an inter-layer insulating film formed on a semiconductor substrate having a diffused layer with a junction depth of 0.2 $\mu$m or less, a contact formed in the inter-layer insulating film and reaching the diffused layer, CVD tungsten formed on the diffused layer within the contact, a barrier metal formed on the surface of the CVD tungsten and the inter-layer insulating film and covering the boundary between them, and an electrode wiring of pure aluminum or aluminum alloy deposited on the barrier metal.

Further, in accordance with the present invention, there is provided a method for fabricating a semiconductor integrated circuit device comprising the steps of providing a contact hole in an inter-layer insulating film on a semiconductor substrate having a diffused layer with a depth of 0.2 $\mu$m or less, selectively depositing tungsten on the diffused layer within the contact hole by CVD (chemical vapor deposition), forming a barrier metal on the surface of the tungsten to cover the boundary between the tungsten and the inter-layer insulating film, depositing pure aluminum or aluminum alloy on a barrier metal to form an electrode wiring, and carrying out heat treatment at the temperature of 400° C. or more.

In the electrode wiring structure and method for fabricating a semiconductor integrated circuit device in accordance with the present invention, the boundary between the tungsten formed in a contact hole and an inter-layer insulating film is covered with a barrier metal so that aluminum used for electrode wiring is prevented from invading a diffused layer and a shallow junction is prevented from being destroyed when heat treatment has been completed.

DESCRIPTION OF THE PREFERRED EMBODIMENTS

Figure 1:
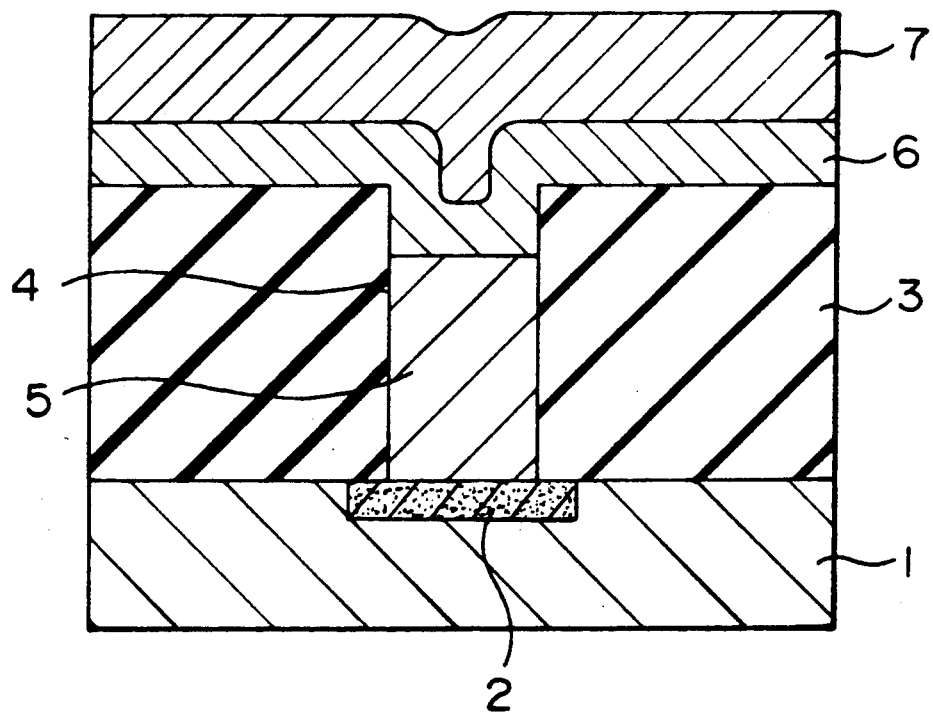
FIG. 1 is a sectional view of an Al/TiN/CVDW/n-+Si contact according to a first embodiment of the present invention.

Now referring to FIG. 1, an Al/TiN/CVDW/n+Si contact according to a first embodiment of the present invention will be explained. In FIG. 1, 1 is a P-type semiconductor Si (silicon) substrate; 2 is an n+ diffused layer; 3 is an inter-layer insulating film; 4 is a contact hole; 5 is CVDW filled in the contact hole; 6 is a barrier metal of TiN; and 7 is an Al wiring.

Figure 2:
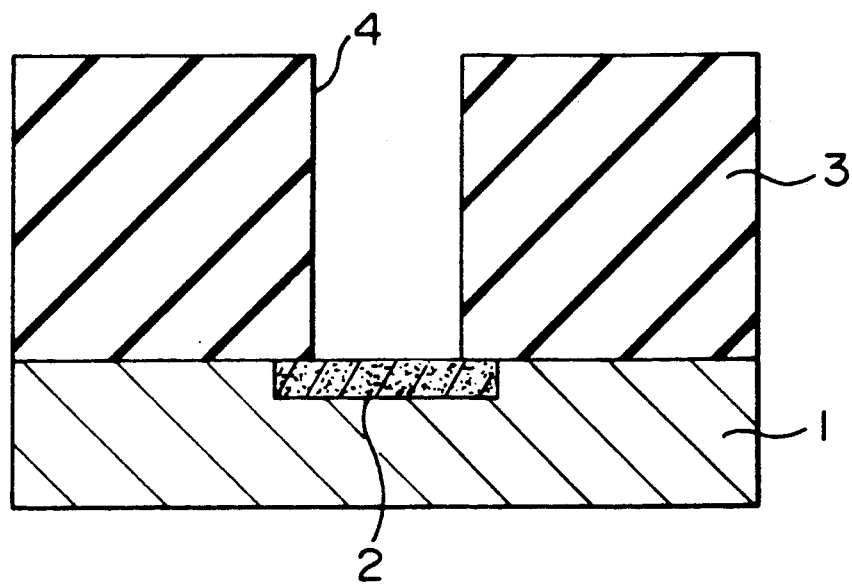
FIGS. 2 and 3 are sectional view showing main steps in the method for fabricating the contact of FIG. 1.
Figure 3:
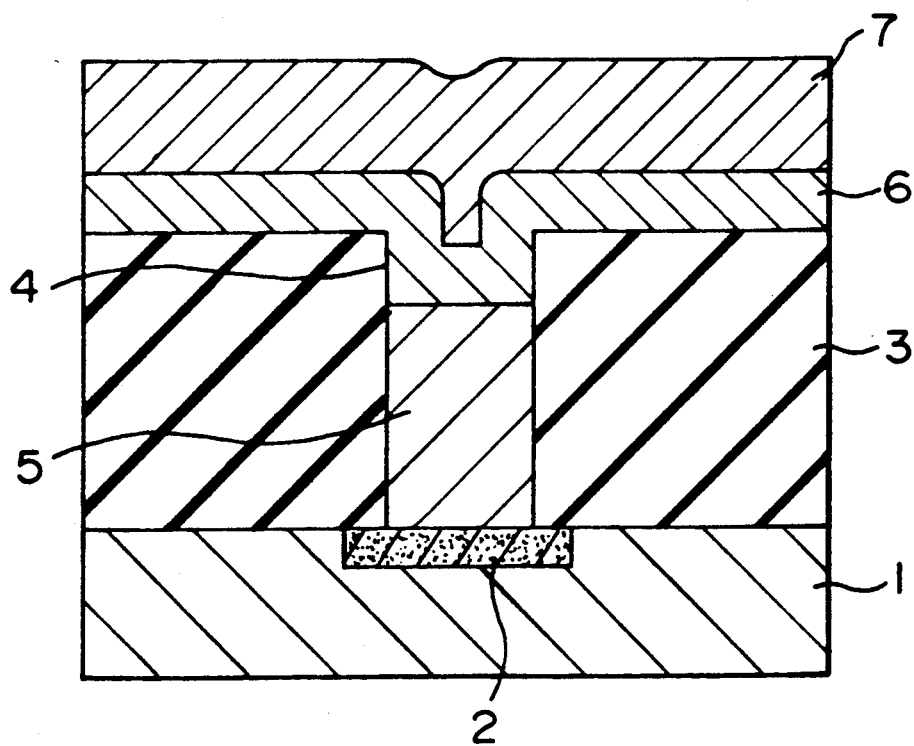
Figure 4:
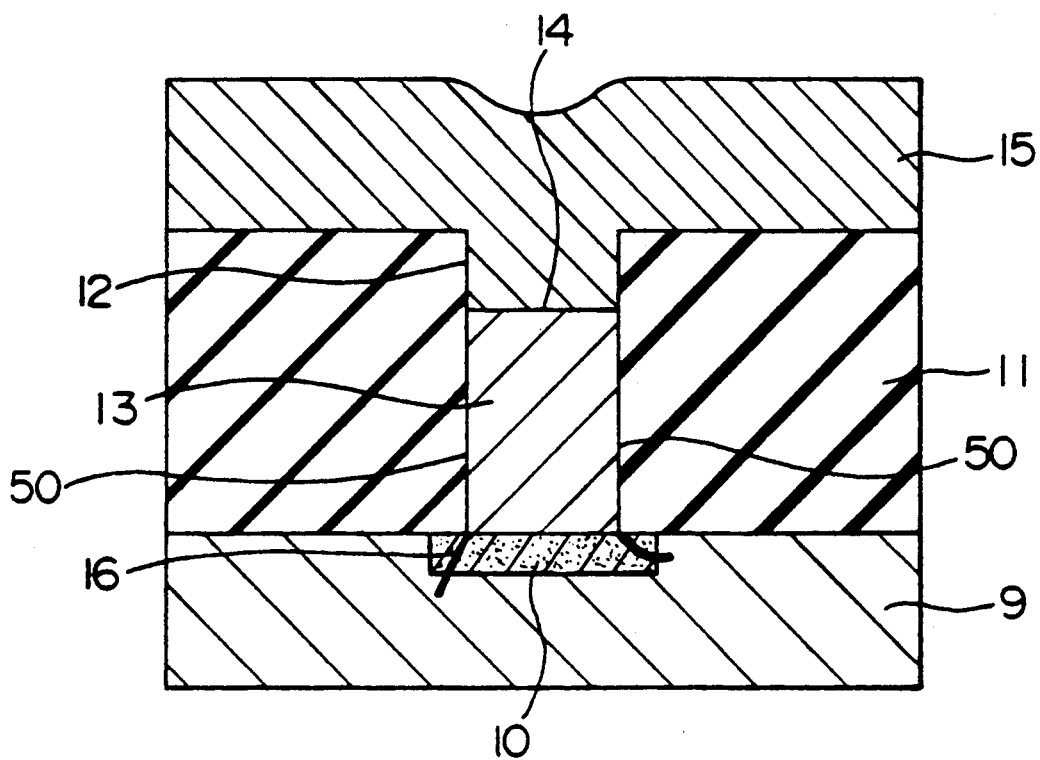
FIG. 4 is a sectional view of the conventional Al/CVDW/n+Si contact.
Figure 5:
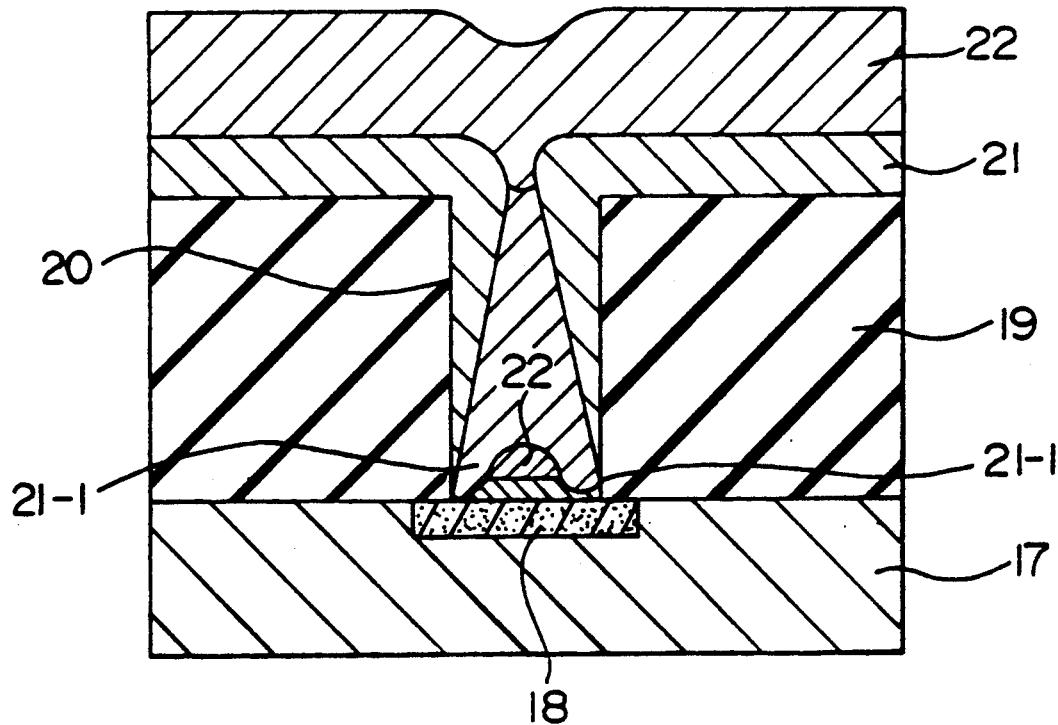
FIG. 5 is a sectional view of the conventional Al/-TiN/n+Si contact.

Now referring to FIGS. 2 and 3, explanation will be given for the electrode wiring structure of FIG. 1. As seen from FIG. 2, after an n+ diffused layer 2 has been formed in a P type semiconductor silicon substrate 1, an inter-layer insulating film 3 is formed on the surface of the substrate, and further a contact hole 4 is formed in the inter-layer insulating film 3. Next, as seen from FIG. 3, a CVD (chemical vapor deposition) W is selectively grown in only the contact hole 4 through the reduction reaction of $SiH_4$ (silane) or $H_2$ (hydrogen) using $WF_6$ (tungsten hexafluoride) gas. Subsequently, a barrier metal (TiN) 6 and aluminum 7 are successively deposited on the entire surface through sputtering, and finally a wiring pattern is formed; the barrier metal may be also formed by CVD.

Figure 6A:
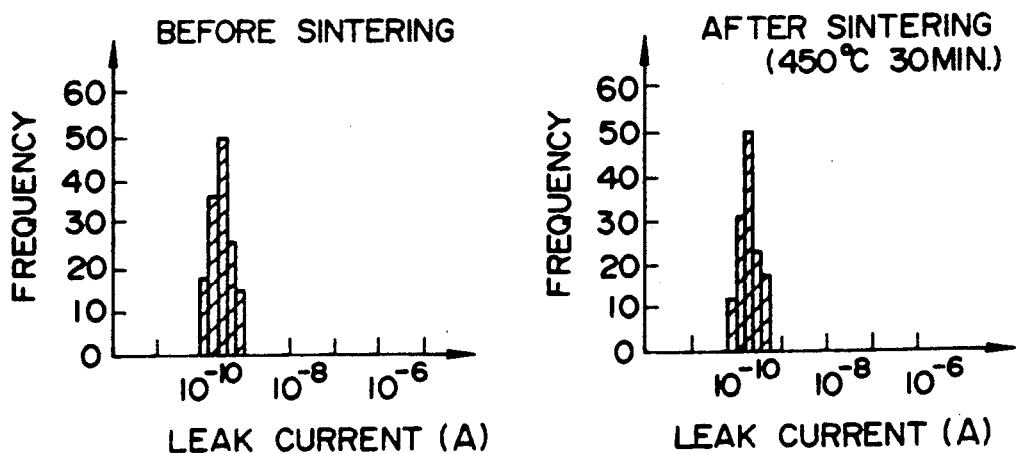
FIGS. 6A to 6C are graphs showing the characteristics of a junction leakage before and after a sintering step in the respective contact structures.
Figure 6B:
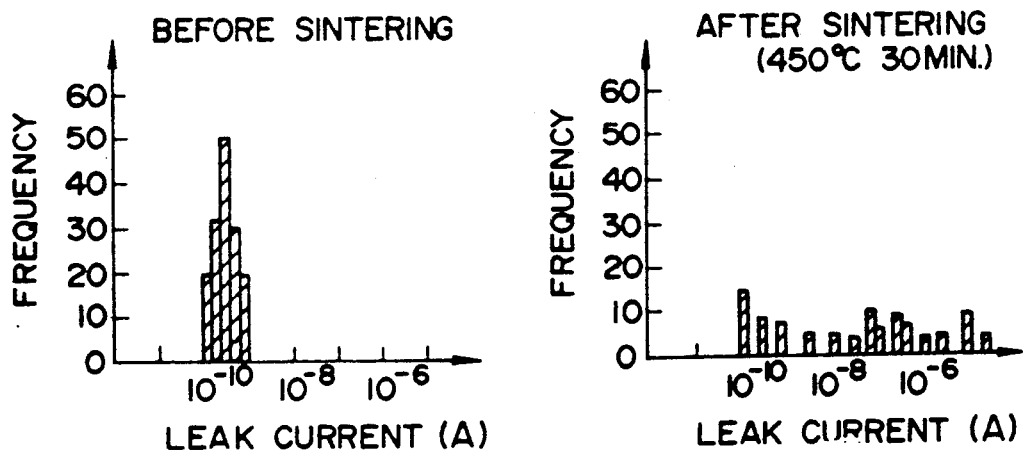
Figure 6C:
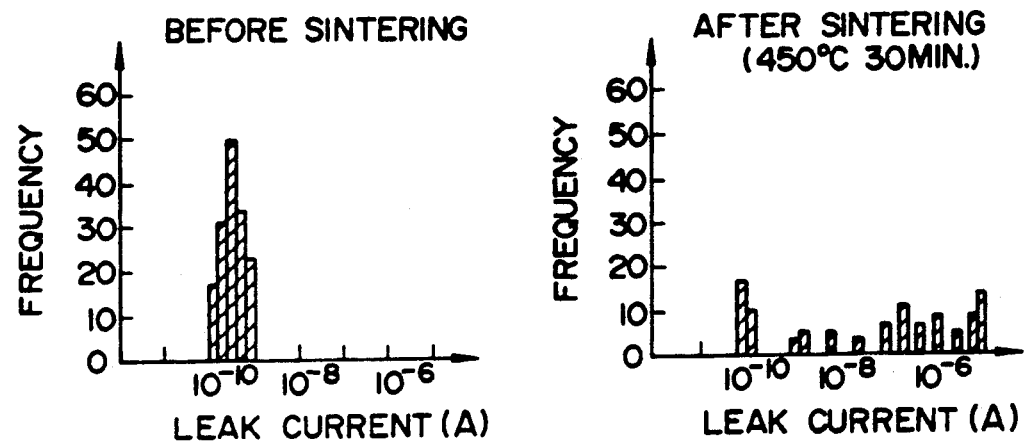

The aspect ratio of the contact hole 4 is 1 to 2, and the depth of the n+ diffused layer 2 is 0.2 $\mu m$. Now it is assumed that the electrode structure having such dimensions has been subjected to heat treatment of 400° C. or more, e.g. sintering of 450° C. for 30 (thirty) minutes, and the leakage current at the n+P junction of the contact before and after the sintering has been measured. The measurement result thereof is shown in FIG. 6A. For comparison, the same measurements have been made on the Al/CVDW/n+Si structure which does not have the barrier metal (TiN) 6 and the Al/TiN/n+Si structure which does not have CVDW 5; these measurement results are shown in FIGS. 6A and 6B. As seen from FIG. 6A, in the Al/TiN/CVDW/n+Si structure according to the embodiment of the present invention, the leakage current does not entirely increase, whereas as seen from FIGS. 6B and 6C, in both of the Al/TiN/n+Si structure and the Al/CVDW/n+Si structure, the leakage current remarkably increases. Incidentally, with respect to the Al/CVDW/n+Si structure, the degradation of the junction leakage characteristic has been also observed under sintering of about 400° C.

The increase of the leakage current in the Al/TiN/n+Si structure is attributable to the facts that the aspect ratio of the contact is as high as 1 to 2, and the barrier metal TiN provides poor level difference coverage and so does not serve as a sufficient barrier. In this case, with the aspect ratio of the contact of 1 or less, the barrier metal provides good level difference coverage so that the leakage current does not increase after the sintering. Incidentally, sintering at 400° C. or more is desired to stabilize the contact resistance at a low value.

The increase in the leakage current of the Al/CVDW/n+Si structure is attributable to the fact that aluminum locally diffuses through the boundary between CVDW and the inter-layer insulating film thereby destroys the junction layer below the boundary. With the depth of the diffused layer of 0.3 $\mu m$ or more, however, the leakage current does not entirely increase after sintering at 500° C. Additionally, the junction breakdown occurs if the sum (depth) of the reaction of CVDW and Si and invasion of Al is larger than the junction depth. Since the diffused layer is eroded by about 0.2 $\mu m$ due to the above reason under the usual sintering condition (550° C. or less), with the junction depth of 0.2 $\mu m$ or less, the junction will be destroyed.

Thus, it can be understood that the electrode structure of Al/TiN/CVDW/n+Si is particularly useful to restrain the leakage current in the case where the aspect ratio of the contact is 1 or more and the junction depth of the contact is 0.2 $\mu m$ or less. In this case, the barrier metal 6 of TiN, which covers the boundary between CVDW on the contact upper surface and the inter-layer insulating film, serves to prevent the aluminum from invading through the boundary and so from greatly diffusing into the junction layer. The barrier metal, therefore, may be any metal such as a refractory metal (e.g. TiW, Ti, W, Mo, etc.) and a silicide (e.g. $MoSi_x$, $TiSi_x$, $WSi_x$, etc. where respective values of subscripts x are between 1.5 and 3) as long as it completely covers the CVD surface to prevent the invasion of Al. Also, in the above structure, the Al wiring is not directly kept in contact with mono-crystalline Si so that the epitaxial growth of Si is difficult to achieve even if Si is contained in the Al wiring; the contact resistance, therefore, is low and stabilized. Thus, the above structure of Al/TiN/CVDW/n+Si is useful regardless of the amount of Si contained in the Al wiring.

As understood from the above description, the electrode structure using the combination of CVDW and the barrier metal according to the above embodiment is particularly useful in the case where the aspect ratio of the contact is 1 or more, and the junction depth of the contact is 0.2 $\mu m$ or less n and the feature of this embodiment resides in this fact.

Figure 7A:
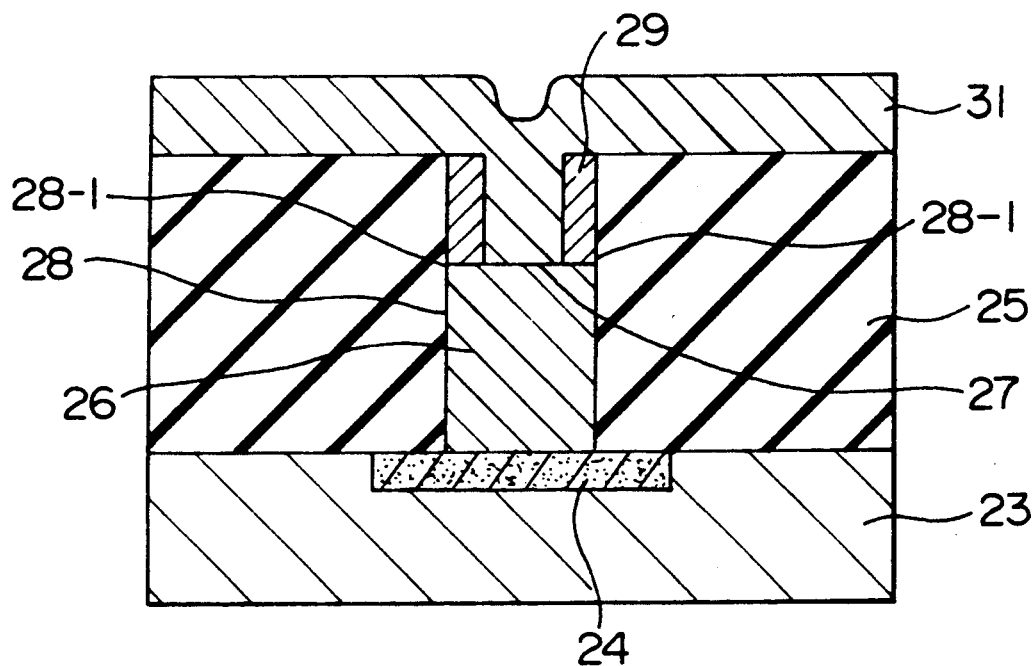
FIGS. 7A and 7B are sectional views of Al/barrier metal/CVDW/n+Si contacts according to a second embodiment of the present invention.
Figure 7B:
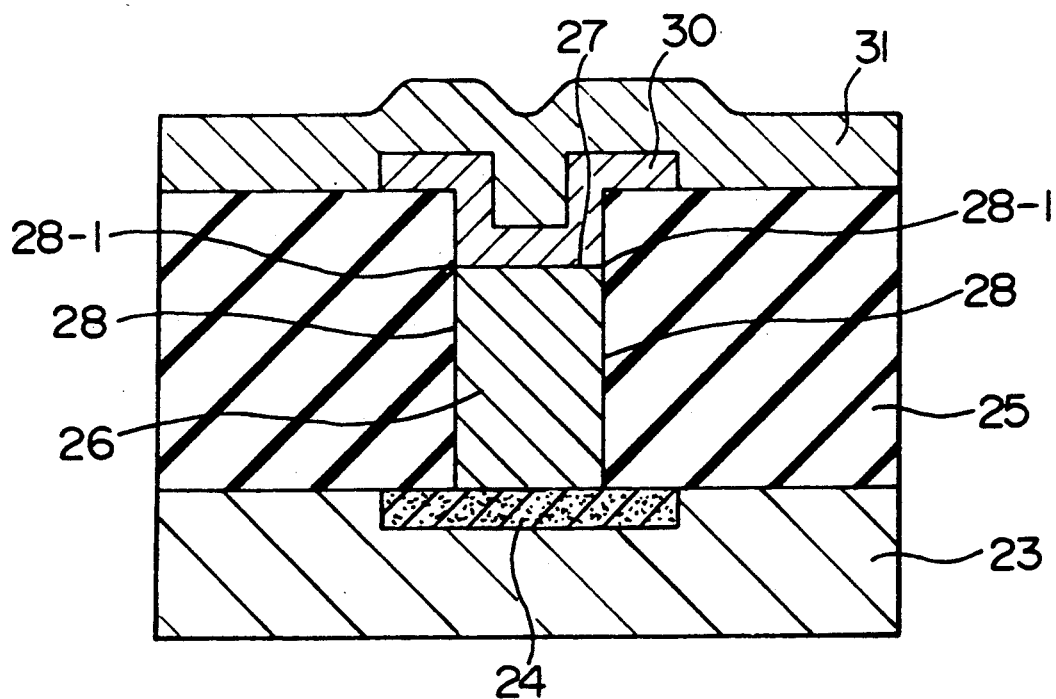

Now referring to FIGS. 7A and 7B, a second embodiment of the present invention will be explained. In FIGS. 7A and 7B, 23 is an Si substrate; 24 is a highly doped layer having a depth of 0.2 $\mu m$ or less; 25 is an inter-layer insulator film; 26 is tungsten (W) selectively filled in the contact hole made in the inter-layer insulator film through CVD; 27 is a surface of the CVDW 26; 28 is a boundary between the CVDW 26 and the inter-layer insulator film 25; 29 is a barrier metal covering the boundary at a part 28-1 of the CVDW surface 27; and 31 is an electrode wiring made of aluminum alloy. In FIG. 7B, a barrier metal covers the entire surface 27 of the CVDW 26 and the boundary at a part 28-1 of the CVDW surface 27. In the structure of FIG. 7A, the barrier metal is first deposited on the entire surface of the CVDW 26 and thereafter the barrier metal 29 is left in a self-aligned manner only on the side of the contact hole through an anisotropic etching step. Thus, the boundary 28 at a part 28-1 of the CVDW surface 27 is covered with the barrier metal 29 so that the invasion of aluminum can be sufficiently restrained. Incidentally, the barrier metal 29 is deposited by sputtering so that aluminum will not invade the boundary between the barrier metal 29 and the inter-layer insulator film 25. In this way, this technique does not require the barrier metal to be formed below the aluminum wiring 31 other than at the contact hole so that the wiring pattern can be easily formed, and thus problems such as incomplete etching, corrosion, etc. do not occur.

The structure of FIG. 7B is also based on the same idea as mentioned above. In FIG. 7B, the barrier metal is processed using a photo-mask at the contact hole to form the barrier metal 30. The structure of FIG. 7B can provide the same effect as that of FIG. 7A, i.e. it can restrain the invasion of aluminum.

Figure 8:
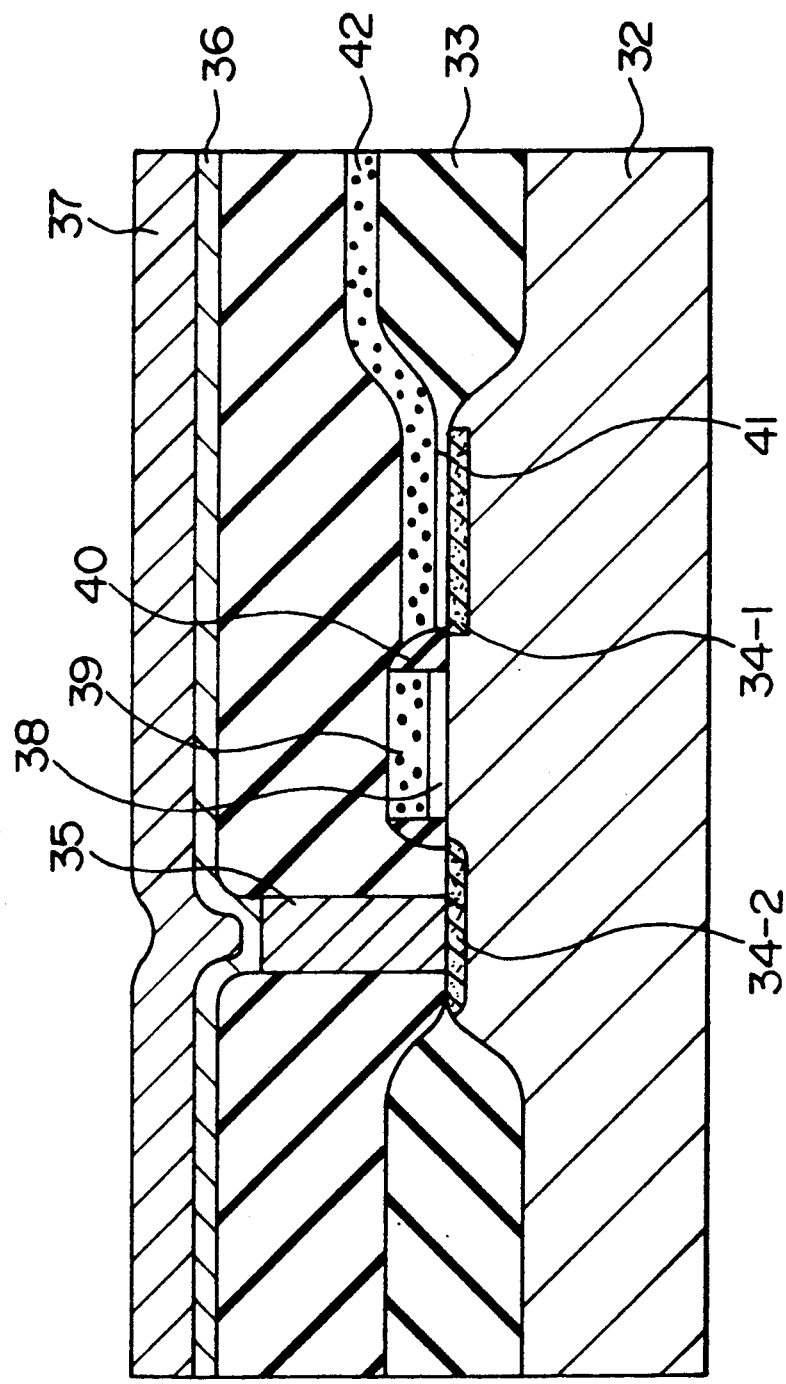
FIG. 8 is a sectional view of the device in which the present invention is applied to a DRAM memory cell.

FIG. 8 shows an example of a DRAM (dynamic random access memory) in which the electrode structure according to the present invention is applied. In FIG. 8, 32 is a semiconductor substrate; 33 is an insulator film for device isolation; 34-1 is an n+ node area of a memory cell (capacitor) part having a diffusion depth of 0.2 μm; 41 is a capacitor insulator film; 42 is a plate electrode (34-1, 41 and 42 constitutes a capacitor); 34-2 is an n+ diffused layer of a bit line part; 35 is a contact electrode of CVDW at a bit contact part; 36 is a barrier metal covering at least the surface of the CVDW 35; 37 is a bit line of aluminum; 38 is a gate oxide film; and 39 is word line of poly-crystalline Si formed on the gate oxide film; 40 is a side wall insulator film for forming LDD.

It should be noted that the leakage current in the memory cell part, particularly the junction between the n− node area 34-1 and the semiconductor substrate 32 must be restrained. This is because the increased leakage current in the read-out causes the charge stored in the memory cell to disappear thereby to deprive the device of its memory function. The structure of FIG. 8 makes it possible to prevent the junction from being destroyed due to the invasion of aluminum 37 and also prevent minute defects from being produced; the leakage current, therefore, can be sufficiently restrained. In the case where the depth of the n+ diffused layers 34-1 and 34-2 is 0.2 μm or less, the presence of the barrier metal 36 can reduce the leakage current by about one order of magnitude (it should be noted that if the depth is 0.3 μm or so, the junction will not be destroyed regardless of the presence of the barrier metal 36). Thus, the electrode structure according to the present invention is particularly useful for devices such as DRAMs which require restraint of leakage current. Incidentally, although the electrode structure was used for the bit line of a DRAM in the above example, it can be provided in the neighborhood of the sense amplifier of a DRAM.

In accordance with the present invention, in the contact having a high aspect ratio and shallow junction layer, the contact resistance can be stably reduced without increasing the leakage current. In this way, a high density high speed integrated circuit device can be realized.

We claim:

1. A method for fabricating a semiconductor integrated circuit device comprising the steps of:
   providing a contact hole in an inter-layer insulating film on a semiconductor substrate having an impurity diffused layer with a depth of a 0.2 μm or less;
   selectively depositing tungsten on the impurity diffused layer within the contact hole by CVD (chemical vapor deposition);
   forming a barrier layer covering the surface of the tungsten and the inter-layer insulating film to block minute crevices formed along the boundary between the tungsten and the inter-layer insulating film;
   depositing pure aluminum or aluminum alloy on the barrier layer to form an electrode wiring; and
   carrying out heat treatment at a temperature of 400° C. or more, wherein said barrier layer is made of one of a refractory metal or a silicide of a refractory metal, said barrier layer preventing aluminum from diffusing along said boundary to contact the impurity diffused layer underlying the tungsten.

2. A method for fabricating a semiconductor integrated circuit device according to claim 1, wherein the aspect ratio of said contact hole exceeds 1.

* * * * *